United States Patent [19]

Sumi et al.

[11] Patent Number: 5,125,999
[45] Date of Patent: Jun. 30, 1992

[54] THIN FILM BONDING METHOD EMPLOYING A STRUCTURE FOR REMOVING WETTING AGENTS

[75] Inventors: Shigeo Sumi, Saitama; Fumio Hamamura, Kanagawa, both of Japan

[73] Assignee: Somar Corporation, Tokyo, Japan

[21] Appl. No.: 514,056

[22] Filed: Apr. 24, 1990

[30] Foreign Application Priority Data

Jun. 4, 1989 [JP] Japan .................. 1-141968

[51] Int. Cl.⁵ .................. B32B 31/10
[52] U.S. Cl. .................. 156/281; 156/87; 156/308.8; 156/324; 156/344; 427/359
[58] Field of Search .................. 156/324, 555, 87, 238, 156/552, 543, 285, 344, 584, 281, 286, 308.8; 427/345, 359; 118/63

[56] References Cited

U.S. PATENT DOCUMENTS

| | | | |
|---|---|---|---|
| 3,029,161 | 4/1962 | Ferner | 427/345 X |
| 3,629,036 | 12/1971 | Isaacson | 156/247 X |
| 3,632,371 | 1/1972 | Mikulka | 118/314 |
| 3,681,039 | 8/1972 | Marzocchi | 427/345 X |
| 4,069,076 | 1/1978 | Fickes | 156/83 |
| 4,378,264 | 3/1983 | Pilette et al. | 156/238 |
| 4,388,129 | 6/1983 | Oizumi | 156/87 X |
| 4,405,394 | 9/1983 | Cohen | 156/83 |
| 4,698,294 | 10/1987 | Lau | 156/241 |
| 4,714,504 | 12/1987 | Cummings et al. | |
| 4,976,817 | 12/1990 | Correa et al. | 156/578 X |
| 4,983,248 | 1/1991 | Seki | 156/555 X |

FOREIGN PATENT DOCUMENTS

| | | |
|---|---|---|
| 0041639 | 5/1981 | European Pat. Off. |
| 0336358 | 4/1989 | European Pat. Off. |
| 2121353 | 12/1983 | United Kingdom |

Primary Examiner—Jeff R. Aftergut
Attorney, Agent, or Firm—Sughrue, Mion, Zinn, Macpeak & Seas

[57] ABSTRACT

A thin film bonding method and apparatus having structure for removing wetting agents applied to a thin film and base plate that are to be bonded by pressure and heat. A spray or rollers apply the wetting agent prior to the initial bonding of a leading edge of the thin film to a leading edge of the base plate. A pressure roller applies heat and pressure to the film and base plate, bonding them together as the roller rotates and drives the plate toward a cleaning position. Suction and agent removal rollers are used to remove the residual excess agent from the bonded film and the pressure roller. The removal rollers are joined together by a link mechanism that has a spring bias and is operation by a gear mechanism that provides a wiping action.

10 Claims, 12 Drawing Sheets

THIN FILM BONDING METHOD EMPLOYING A STRUCTURE FOR REMOVING WETTING AGENTS

FIELD OF THE INVENTION

The present invention relates to the art of bonding a thin film, and particularly relates to the art of bonding a thin film to the surface of a base plate.

DESCRIPTION OF THE BACKGROUND

In a printed circuit board for an electronic machine such as a computer, wiring is made of copper or the like in a prescribed pattern on at least one side of an electrically insulating base plate. The printed circuit board is manufactured as described from now on. A multi-layer film consisting of a photosensitive resin layer—which is a photoresist layer—and a light-transmissible resin film—which is a protective film for protecting the resin layer—is first bonded, under heat and pressure, to an electroconductive layer which is a thin copper film provided on the electrically insulating base plate. This heat and pressure bonding is performed in a mass production by a thin film bonding apparatus usually referred to as laminator. A wiring pattern film is then overlaid on the multi-layer film. The photosensitive resin layer is exposed to light through the wiring pattern film and the light-transmissible resin film for a prescribed time. The light-transmissible resin film is thereafter peeled from the photosensitive resin layer by a peeling unit. The photosensitive resin layer exposed to the light is then developed so that an etching mask pattern is created. After that, the unnecessary head of the electroconductive layer are removed by etching. The remaining portions of the photosensitive resin layer are then removed. The printed circuit board having wiring in the prescribed pattern is thus manufactured.

The multi-layer film consisting of the photosensitive resin layer and the light-transmissible resin film is bonded, under heat and pressure, to the electroconductive layer on the electrically insulating base plate by a conventional method of thin film bonding. Since the surface of the electroconductive layer has minute recesses and projections, air remains in the recesses when the multi-layer film is bonded to the surface of the electroconductive layer. For that reason, air bubbles are made between the mutually bonded surfaces of the multi-layer film and the electroconductive layer so that the adhesion of the film and the layer is lowered. This is a problem, and results in a reduced reliability of the wiring of the printed circuit board.

The present invention was made in order to solve the problem.

Accordingly, it is an object of the present invention to provide a method of bonding a thin film to a base plate so as to enhance the reliability of the assembly of the plate and the film stuck thereto.

It is another object of the present invention to provide a method for enhancing the reliability of printed circuit boards.

It is yet another object of the present invention to provide a method of preventing air bubbles from being made between the mutually bonded surfaces of a multi-layer film and an electroconductive layer provided on a base plate.

It is yet another object of the present invention to provide a method in which any excess air bubble preventive agent remaining on a pressure bonding roller and that remaining on a thin film bonded to a base plate are removed therefrom through suction, downstream of the roller in the direction of the conveyance of the base plate.

The above-mentioned and other objects of the present invention and the novel features thereof will be apparent from the description herein and the drawings attached hereto.

SUMMARY OF THE INVENTION

In a thin film bonding method provided in accordance with the present invention, an air bubble preventive agent is caused to cling to a thin film before a base plate is conveyed to an initial bonding position in a base plate conveyance passage. An initial bonding head is moved to the vicinity of the surface of the base plate at the leading edge thereof so that the leading edge of the thin film is bonded to the surface of the base plate at the leading edge thereof. The initial bonding head is then moved away from the surface of the base plate. A pressure bonding roller is thereafter put into contact with the initially bonded leading edge of the thin film and rotated so that the base plate is conveyed and the thin film is completely bonded to the base plate. In this method, the excess air bubble preventive agent remaining on the pressure bonding roller and that remaining on the thin film bonded to the base plate are removed therefrom through suction, downstream to the roller in the direction of the conveyance of the base plate.

In a thin film bonding apparatus provided in accordance with the present invention, an initial bonding head is moved to the vicinity of the surface of a base plate at the leading edge thereof in a base plate conveyance passage so that the leading edge of a thin film is bonded to the surface of the base plate at the leading edge thereof. The initial bonding head is then moved away from the surface of the base plate. A pressure bonding roller is thereafter put into contact with the bonded leading edge of the thin film and rotated so that the base plate is conveyed and the thin film is completely bonded to the base plate. The apparatus includes a wetting roller which is for applying air bubble preventive agent to the base plate, and is provided at the frame of a base plate conveyance passage unit and located so that the agent is caused to cling to the base plate before the plate is conveyed to the initial bonding position; a structure for nearly uniformly feeding the agent from the interior of the wetting roller toward the outside surface thereof: and a structure for removing the excess air bubble preventive agent remaining on the pressure bonding roller and that remaining on the thin film bonded to the base plate, the excess agent being removed therefrom at the same time downstream of the pressure bonding roller in the direction of the conveyance of the base plate.

The air bubble preventive agent removal structure may include a pair of link mechanisms coupled to each other by matching gears, which are moved by the moving member of a cylinder. Each of the link mechanisms is made of first and second links. The first link is pushed outward by a compressed spring. A base plate wiping roller for removing the excess air bubble preventive agent remaining on the thin film bonded to the base plate is rotatably supported by the first link. A wiping roller for removing the excess air bubble preventive agent remaining on the pressure bonding roller is rotatably supported by the second link.

In the thin film bonding apparatus provided in accordance with the present invention, the wetting roller for causing the air bubble preventive agent to cling to the base plate is provided at the frame of the base plate conveyance passage unit and located so that the agent is caused to cling to the base plate before the base plate is conveyed to the initial bonding position. Besides, the means for nearly uniformly feeding the air bubble preventive agent from the interior of the wetting roller toward the outside surface thereof is provided at the frame of the base plate conveyance passage unit so that the agent is nearly uniformly fed to the entire outside surface of the wetting roller. As a result, the agent nearly uniformly clings to the surface of the base plate before the plate is conveyed to the initial bonding position. For that reason, the thin film is put into tight contact with the surface of the electroconductive layer of the base plate, and air bubbles are prevented from forming between the mutually bonded surfaces of the thin film and the electroconductive layer.

By removing the excess air bubble preventive agent remaining on the pressure sticking roller and that remaining on the thin film stuck to the base plate at the same time, downstream to the roller, a stain, a contamination or the like is prevented from being made on the base plate bonded with the thin film. For that reason, the reliability of making a wiring pattern by exposure to light and the yield in the making are enhanced. The yield is particularly enhanced by the structure used to effectively remove the air bubble preventive agent.

DESCRIPTION OF THE PREFERRED EMBODIMENTS OF THE INVENTION

Figure 1:
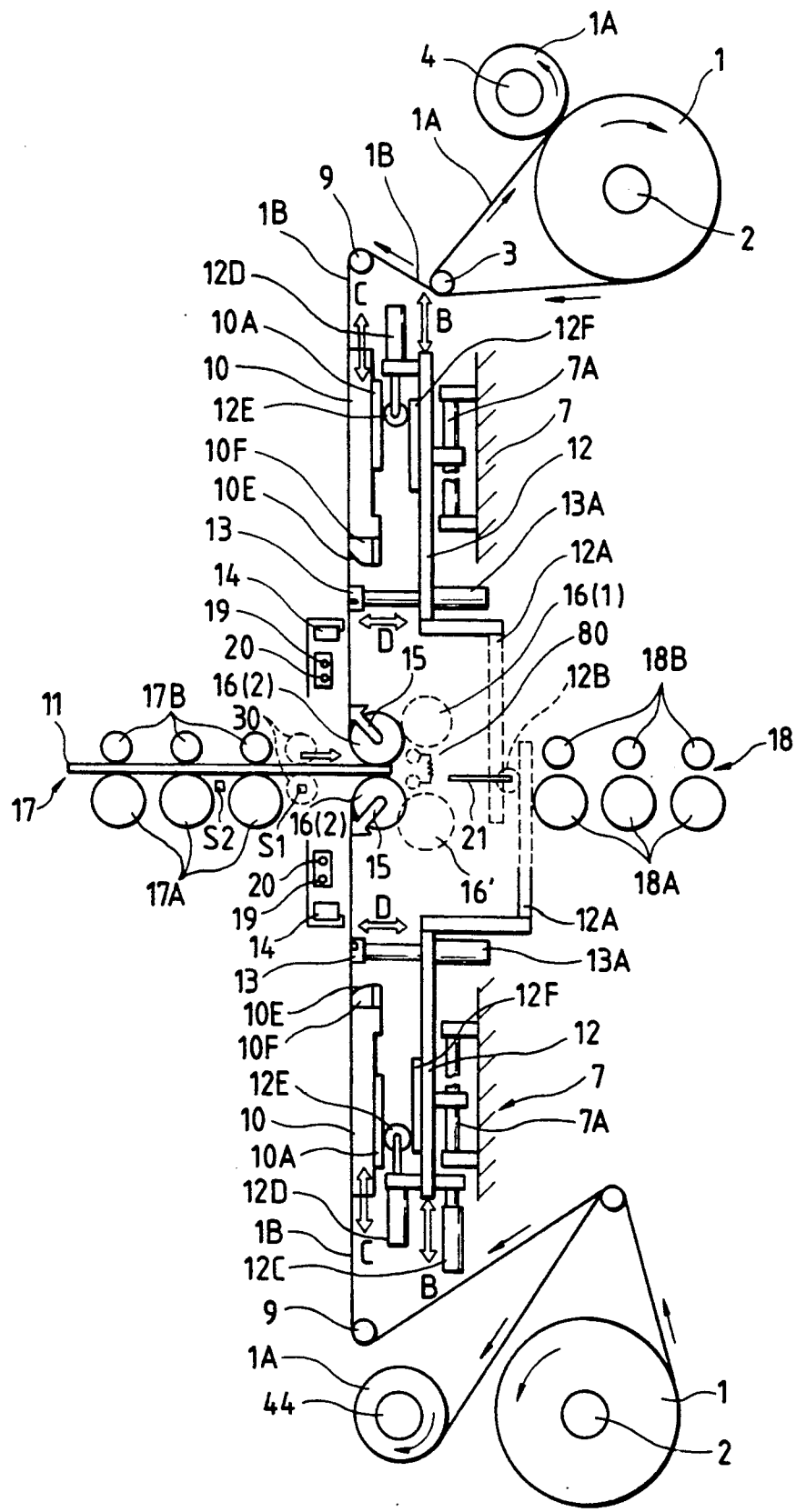
FIG. 1 is a schematic view of a thin film sticking apparatus which is embodiment of the present invention.

The embodiments of the present invention are hereafter described in detail with reference to the drawings attached hereto. Mutually equivalent portions shown in the drawings are denoted by the same reference symbols and not repeatedly described in detail hereinafter.

FIG. 1 is a schematic view of a thin film bonding apparatus which illustrates one of the embodiments of the present invention. In the Figure, a multi-layer film 1, consisting of a light-transmissible resin film, a photosensitive resin layer and another light-transmissible resin film, is bonded under heat and pressure to a base plate film 11 for a printed circuit board. The multi-layer film 1 is continuously wound on a supply roller 2 in advance. The multi-layer film 1 from the supply roller 2 is divided, by a thin film separation roller 3, into one light-transmissible resin film 1A, which is a protective film, and a multi-layer film 1B consisting of the other light-transmissible resin layer whose one side is uncovered and is to be bonded to the electrically insulating base plate 11. The divided light-transmissible resin film 1A is wound on a winding roller 4.

Figure 2:
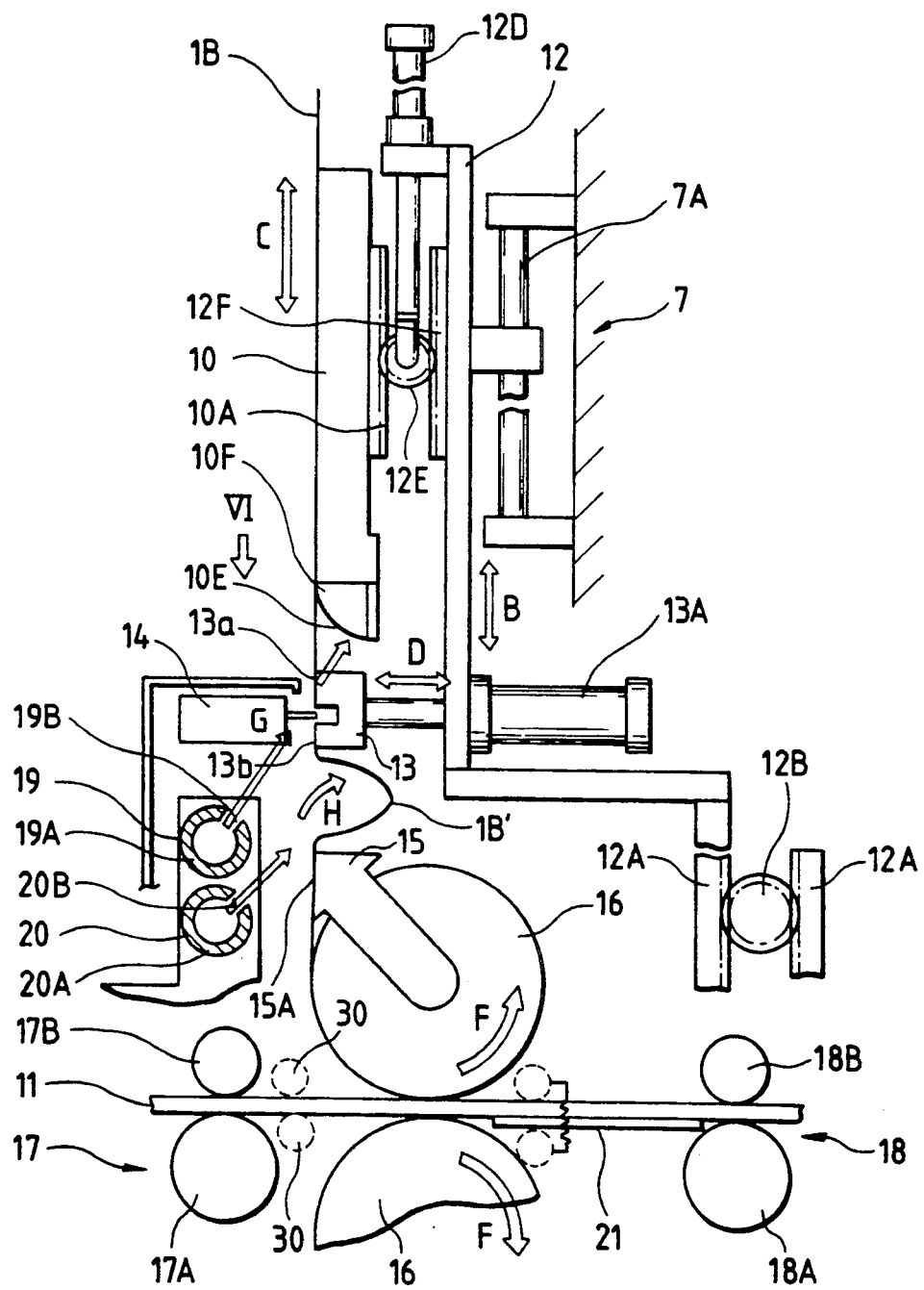
FIG. 2 is an enlarged partial view of the apparatus.

As shown in FIGS. 1 and 2, which is an enlarged partial view of the apparatus, the leading edge of the multi-layer film 1B is held by a main vacuum suction plate 10. A tension roller 9 functions to apply appropriate tension to the multi-layer film between the supply roller 2 and the main vacuum suction plate 10 so as to prevent the film from being wrinkled or the like. The main vacuum suction plate 10 acts to feed the multi-layer film 1B from the supply roller 2 onto an electroconductive layer, such as a thin copper film, on the electrically insulating base plate 11. The main vacuum suction plate 10 is provided on a support member 12, which is moved toward and away from the conveyance passage for the base plate 11 as shown by arrow B in FIGS. 1 and 2. The support member 12 is provided on the body 7 of the apparatus so that the support member is slidable on a guide member 7A as shown by the arrows B in FIGS. 1 and 2. A pair of such support members 12 are provided over and under the conveyance passage for the base plate 11. The upper and the lower support members 12 are coupled to each other by a rack and pinion mechanism so that the support members are simultaneously moved toward and away from each other by a driver 12C. The rack and pinion mechanism includes racks 12A provided on the upper and the lower support members 12, and a pinion 12B engaged with the racks. The driver 12C is directly coupled to the lower support member 12. For example, the driver 12C is a pneumatic cylinder which is controlled by a solenoid valve. The driver may be a hydraulic cylinder, an electromagnetic cylinder, a step motor, or a transmission mechanism whose movement is transmitted to the support members 12.

The main vacuum suction plate 10 is provided on the support member 12 in such a manner that the plate can be moved toward and away from the electrically insulating base plate 11 independently of the movement of the support member, as shown by arrows C in FIGS. 1 and 2. The movement of the main vacuum suction pate 10 is caused by a driver 12D through the action of a rack and pinion mechanism. The driver 12D is provided on the support member 12. The rack and pinion mechanism includes a pinion 12E coupled to the driver 12D, a rack 12F provided on the support member 12 and a rack 10A provided on the main vacuum suction plate 10. The plate 10 has a plurality of suction holes which are not shown in the drawings and function to suck the multilayer film 1B on the pate to hold the film thereon. The suction holes are connected to a vacuum source, such as a vacuum pump, through an air discharge pipe. The sucking action of the pate 10 and that of an initial bonding head 10E is integrated with the plate 10 at the downstream end thereof with regard to the direction of the feed of the multi-layer film 1B. The initial bonding head 10E has a curved surface, onto which the film 1B is sucked and held. As shown in FIGS. 1 and 2, a heater 10F for heating the curved surface of the initial bonding head 10E is provided therein. The portion 13E functions so that the leading edge of the multi-layer film 1B.,fed by the main vacuum suction plate 10, is applied under heat and pressure to the electroconductive layer on the base plate 11. The plate 10 and the portion 10E may be constituted by mutually separate members supported by the support member 12.

An auxiliary vacuum suction plate 13, which is a thin film holding member, is provided near the initial bonding head 10E, and located in the vicinity of the feed passage for the multi-layer film 1B between the initial bonding head and the conveyance passage for the electrically insulating base plate 11. As shown in FIG. 2, the plate 13 has an upper sucking portion 13a and a lower sucking portion 13b which have suction holes not shown in the drawings. The plate 13 is U-shaped. The multi-layer film 1B is cut off between the upper and the lower sucking portions 13a and 13b. The upper sucking portion 13a sucks the leading edge of the multi-layer film 1B, in the main, so that the leading edge is sucked and held on the initial bonding head 10E. The auxiliary vacuum suction plate 13 is attached to the support member 12 by a driver 13A. For example, the driver 13A is a pneumatic cylinder, which is moved toward and away, from the feed passage for the multi-layer film 1B as shown by arrows D, so that the leading edge of the film is sucked on the initial bonding head 10E. The trailing edge of the portion of the multi-layer film 1B, which is cut off from the following portion thereof between the upper and the lower sucking portions 13a and 13b of the auxiliary vacuum suction plate 13 by a cutoff unit 14, is sucked by the lower sucking portion 13b so that the trailing edge is held in the feed passage for the film. After the bonding of film 1B under heat and pressure to the electroconductive layer on the base plate 11 is virtually complete, the lower sucking portion 13b acts to make a loosened part 1B' of the multi-layer film 1B between the lower sucking portion and a rotary vacuum suction bar 15 as shown in FIG. 2. The speed of the feed of the multi-layer film 1B by the main vacuum suction plate 10 is rendered higher than the circumferential velocity of a heat and pressure bonding roller 16 so that the loosened multi-layer film 1B' is created. The speed of the feed and the circumferential velocity of the roller 16 are regulated by a sequence control circuit not shown in the drawings. The driver 13A for the auxiliary vacuum suction plate 13 may be a hydraulic cylinder or the like.

The cutoff unit 14 is secured to the body 7 of the apparatus near the feed passage for the multilayer film 1B between the initial bonding head 10E and the rotary vacuum suction bar 15 also located near an upstream conveyor 17 for the base plate 11 so that the cutoff unit is opposed to the auxiliary vacuum suction plate 13 having fed the trailing edge of the multilayer film to the position of the cutoff thereof. The cutoff unit 14 may be provided on the upstream conveyor 17. The multi-layer film 1B, which is continuously fed by the main vacuum suction plate 10, is cut off, by the cutoff unit 14, to a prescribed length corresponding to the length of the base plate 11.

The multi-layer film 1B, that is initially bonded at its leading edge thereof, under heat and pressure, to the electroconductive layer on the base plate 11 by the initial bonding head 10E of the main vacuum suction plate 10 shown in FIGS. 1 and 2, is completely bonded, under heat and pressure, to the electroconductive layer on the base plate by the heat and pressure bonding roller 16. When the leading edge of the multi-layer film 1B is initially bonded to the electroconductive layer on the base plate 11 by the initial bonding head 10E, the heat and pressure bonding roller 16 is located in a put-aside position 16(1) shown by a dotted line in FIG. 1, so that the initial bonding head being moved toward the initial bonding position does not come into contact with the roller. After the initial bonding is performed, the roller 16 is moved from the put-aside position 16(1) to the position 16(2) shown by a full line in FIG. 1. The upper and the lower multi-layer films 1B and the base plate 11 are pinched by the upper and the lower bonding rollers 16 moved to the upper and the lower initial bonding positions 16(2).

The trailing edge of the multi-layer film 1B cut off by the cutoff unit 14 is guided by the triangularly-shaped rotary vacuum suction bar 15 so that the film does not undergo a wrinkle or the like. The film 1B is then completely bonded, under heat and pressure, to the electroconductive layer on the base plate 11 by the heat and pressure bonding roller 16. The bar 15 is supported by the same shaft as the roller 16 so that the bar is rotated about the shaft. The surface of the bar 15, which faces the multi-layer film 1B, has a plurality of suction holes 15A not shown in the drawings, and is similar in constitution and operation to the suction surface of the main vacuum suction plate 10. The top of the bar 15 may have such suction holes so that it is made easier to make the loosened part 1B of the multilayer film 1B as shown in FIG. 2.

Figure 3:
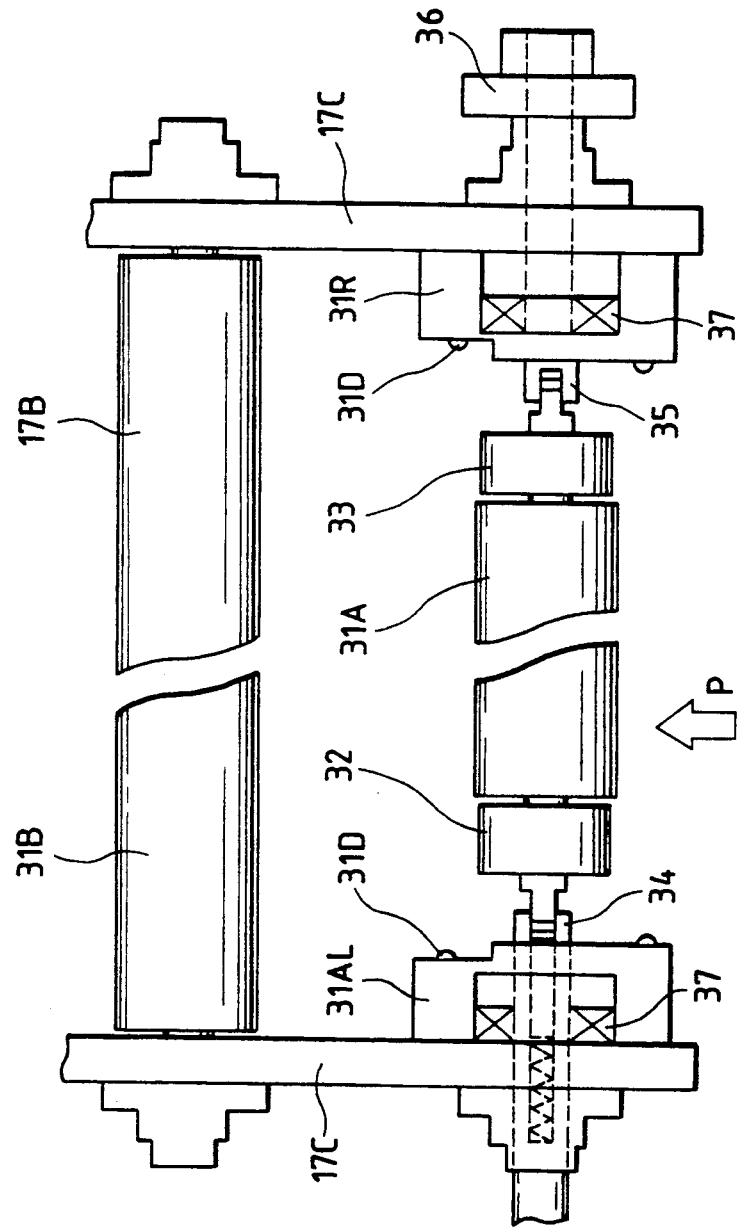
FIG. 3 is a plan view of the lower wetting roller of the wetting roller unit of the apparatus.
Figure 4:
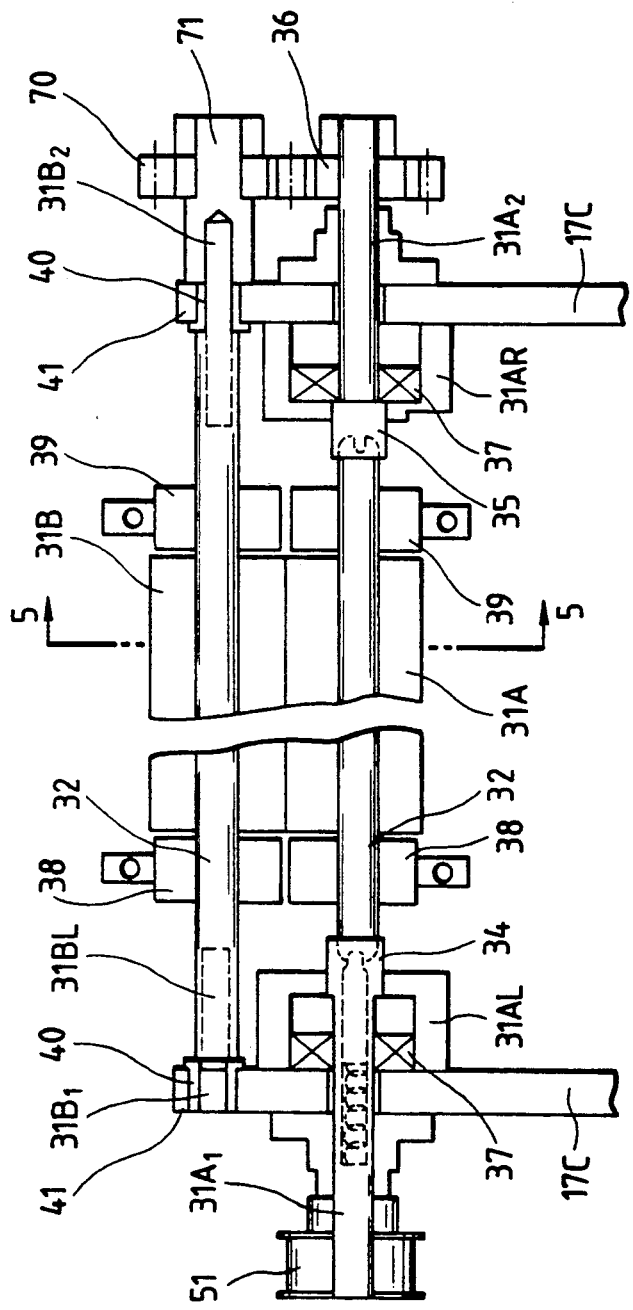
FIG. 4 is a plan view of the wetting roller unit seen along an arrow P shown in FIG. 3.
Figure 5:
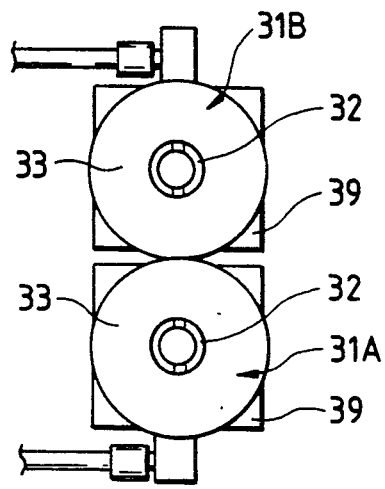
FIG. 5 is a sectional view of the wetting roller unit along a line 5—5 shown in FIG. 4.
Figure 7:
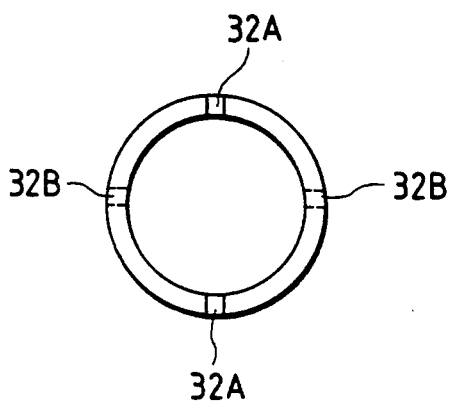
FIG. 7 is a sectional view of the water feed pipe, and shows the disposition of the water feed holes thereof.
Figure 6:
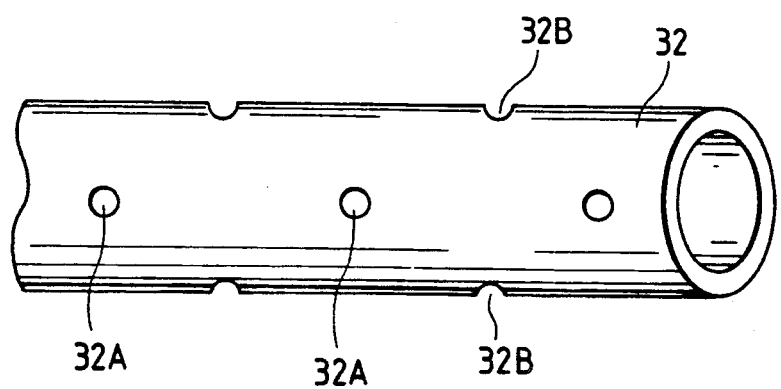
FIG. 6 is a perspective view of the water feed, pipe of the wetting roller unit.

The base plate 11 is conveyed to the initial bonding position by the upstream conveyor 17 which includes lower driving conveyance rollers 17A and upper idle conveyance rollers 17B, as shown in FIGS. 1 and 2. The conveyor 17 is fitted with a wetting roller unit 30 for causing water as an air bubble preventive agent to cling to the electroconductive layer on the base plate 11 before the plate is conveyed to the initial bonding position. The wetting roller unit 30 has a pair of wetting rollers 9, lower wetting roller 31A and upper wetting roller 31B, which are rotatably supported by the frame 17C of the conveyor 17, as shown in FIGS. 3. 4 and 5. FIG. 3 is a plan view of the lower wetting roller 31A. FIG. 4 is a view of the wetting roller unit 30 seen along an arrow P shown in FIG. 3. FIG. 5 is a sectional view of the roller unit 30 along a line 5—5 shown in F1G. 4. Each of the wetting rollers 31A and 31B includes a water feed pipe 32 having a plurality of water feed holes 32A and 32B and made of a hard-to-rust metal such as stainless steel and aluminum processed not to corrode, or of hard plastic, and a coating layer 33 made of a porous material and provided on the surface of the water feed pipe, as shown in FIGS. 5. 6 and 7. FIG. 6 is a perspective view of the water feed pipe 32. FIG. 7 is a sectional view of the pipe 32, which is for illustrating the disposition of the water feed holes 32A and 32B. The porous material can contain a relatively large quantity of water as sponge does. The water feed holes 32A and 32B of the water feed pipe 32 of the lower wetting roller 31A are disposed so that the holes 32A are opposed to each other in the diametral direction of the pipe and the other holes 32B are opposed to each other in the other diametral direction of the pipe and have a prescribed angular interval of 90 degrees from the former holes. The water feed pipe 32 of the lower wetting roller 31A is removably coupled to the rotary shafts $31A_1$ and $31A_2$ of the roller by connectors 34 and 35 provided at the rotary shafts. The rotary shaft is rotatably coupled to the same driver as the driving conveyance rollers 17A of the upstream conveyor 17 by a shaft bearer 31AL so that the shaft is rotated synchronously with the driving conveyance rollers. The shaft bearer 31AL is secured to the frame 17C of the upstream conveyor 17 by screws. The other rotary shaft $31A_2$ is rotatably supported by a shaft bearer 31AR and is fitted with a gear 36. A bearing 37 is provided in the shaft bearer 31AR.

A water feeder 38 is provided at the left end of the water feed pipe 32 of the lower wetting roller 31A. A water drainer 39 is provided at the right end of the pipe 32. A water feeder 38 is provided at the left end of the water feed pipe 32 of the upper wetting roller 31B. A water drainer 39 is provided at the right end of the pipe 32 of the roller 31B. The water feeders 38 and the water drainers 39 are attached to the frame 17C of the upstream conveyor 17 by a fastening frame.

The upper wetting roller 31B is an idle roller. Rotary shafts $31B_1$ and $31B_2$ are provided at the ends of the water feed pipe 32 of the roller 31B and fitted with bearings 40 made of a material of lower hardness than the frame 17C of the conveyor 17 and removably engaged in notches 41 provided in the frame and shaped as U.

As shown in FIG. 4, a gear 70, which is engaged with the gear 36 mounted on the rotary shaft $31A_2$, is mounted with a mounting member 71 on the rotary shaft $31B_2$ of the upper wetting roller 31B at the right end of the shaft so that the rotation of the lower wetting roller 31A is transmitted to the upper wetting roller.

Figure 8:
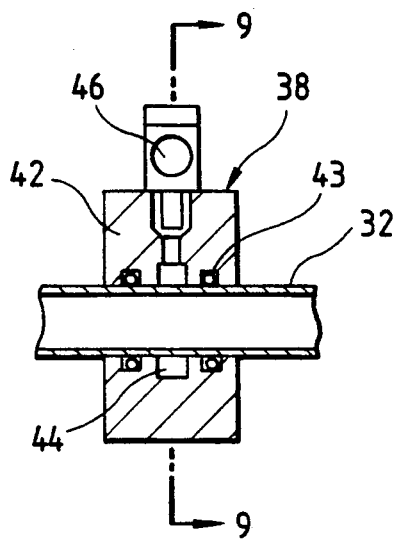
FIG. 8 is a sectional view of a major part of the water feeder of the wetting roller unit.
Figure 9:
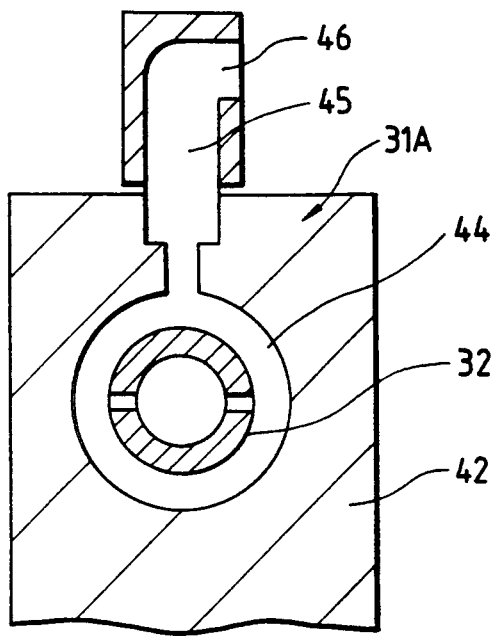
FIG. 9 is an enlarged sectional view of the water feeding along a line 9—9 shown in FIG. 8.

The water feeders 38 and the water drainers 39 are described in detail hereafter. The water feed pipe 32 extends through the support member 42 of each of the water feeders 38 and the water drainers 39, and is rotatably and hermetically sealed by an O-ring 43, as shown in FIGS. 8 and 9. FIG. 8 is a sectional view of a major part of each water feeder 38. FIG. 9 is an enlarged sectional view of the major part along a line 9—9 shown in FIG. 8. A reservoir 44 is provided in the central portion of the support member 42 and connected to a water feed or drain hole 45, at the end of which a water feed or drain port 46 is provided. The water feed pipe 32 and the support member 42 are disposed so that the water feed holes 32A or water drain holes 32B of the pipe are placed in the reservoir 44.

Figure 10:
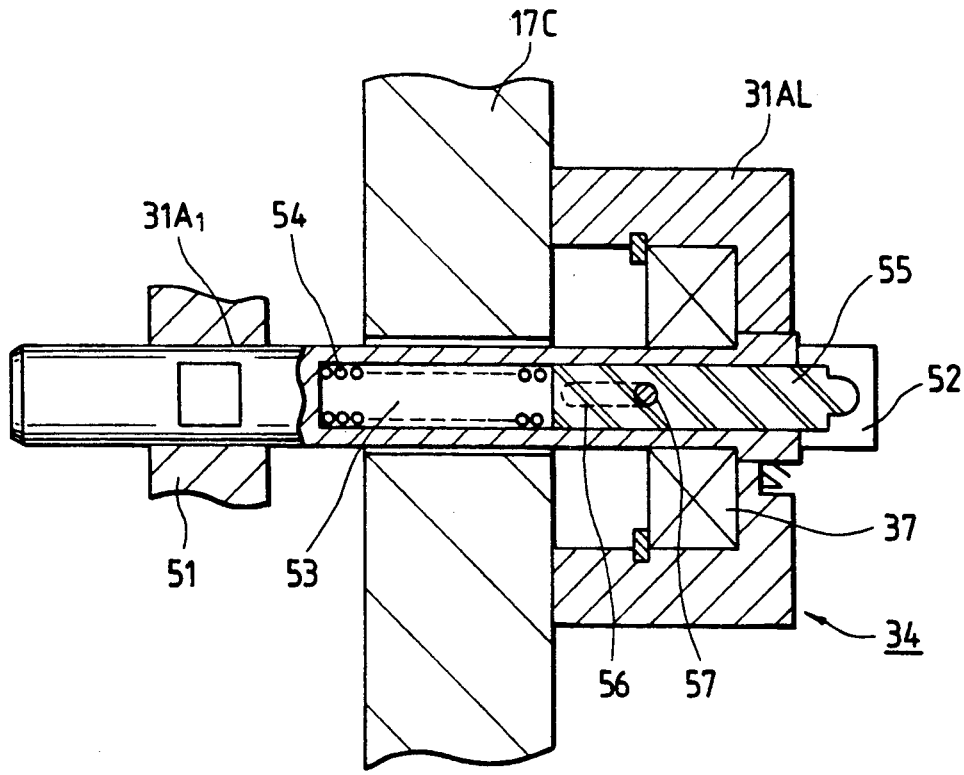
FIG. 10, 11, 12. 13 and 14 are views for explaining the constitution of the connector of the wetting roller unit in detail.
Figure 11:
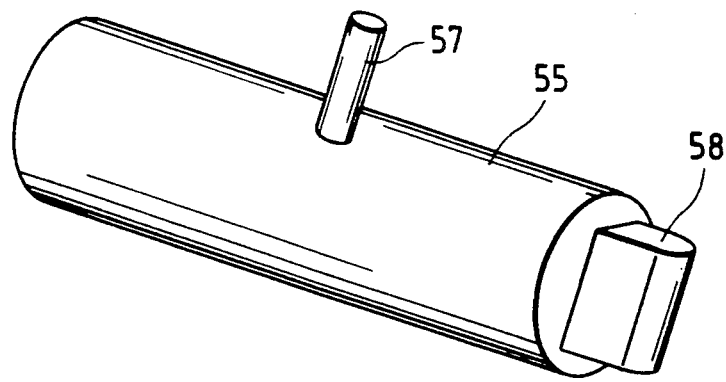
Figure 12:
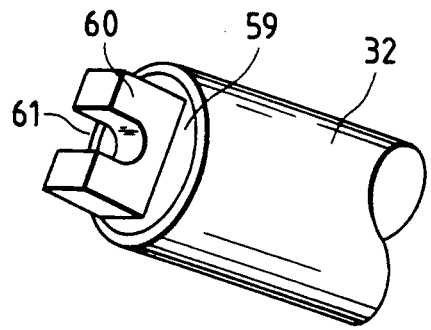
Figure 13:
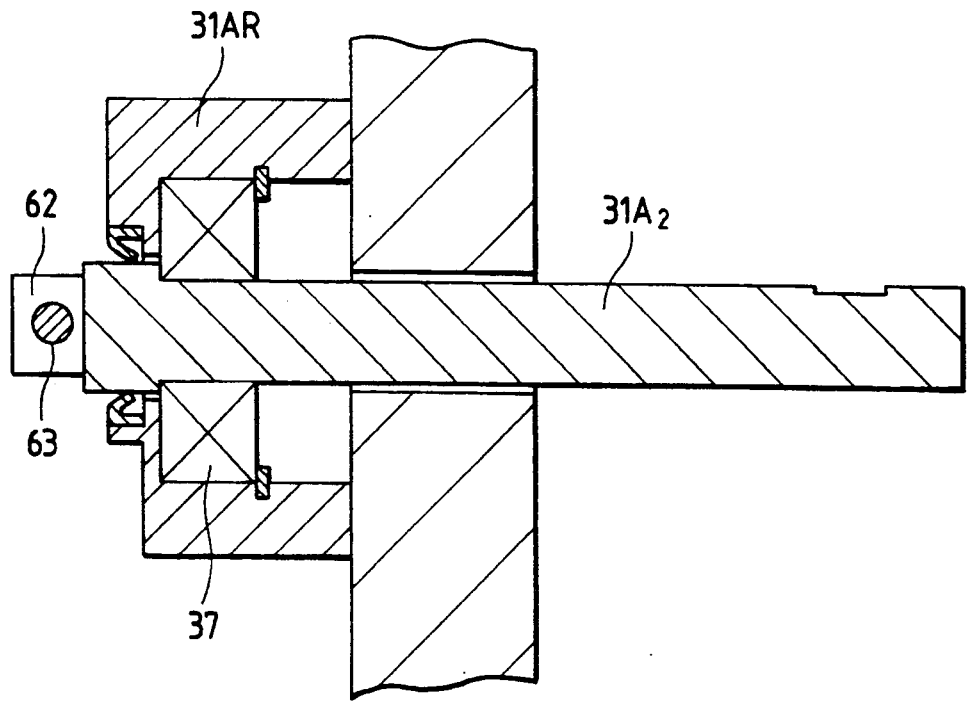
Figure 14:
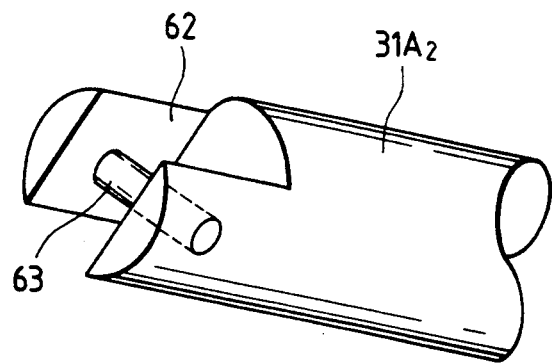

The two connectors 34 and 35 for water pipe 32 are now described in detail with reference to FIGS. 10, 11, 12, 13 and 14. FIG. 10 is a sectional view of the connector 34, the rotary shaft $31A_1$ and the shaft bearer 31AL. As shown in FIG. 10, the connector 34 for the rotary shaft $31A_1$ has a guide opening 52 at the center of the end of the connector, the guide opening being located at one end of the rotary shaft. A pulley 51 is mounted on the other end of the rotary shaft $31A_1$. The shaft $31A_1$ has a guide hole 53 extending from the guide opening 52 toward the pulley 51 concentrically to the shaft. A connection guide bar 55 is fitted together with a helical spring 54 or the like in the guide hole 53. The rotary shaft $31A_1$ has a slender opening 56 in a prescribed position on the guide hole 53. A stopper pin 57 is secured in a prescribed position to the connection guide bar 55 and slidably fitted in the slender opening 56, as shown in FIG. 11. A connecting projection 58 is integrally provided on the end of the connection guide bar 55 at the water feed pipe 32, as shown in FIG. 11. The connector 34 has a connecting projection 60 integrally provided on the central portion of a connecting member 59 provided on the end of the water feed pipe 32, and a connecting opening 61 provided in the central portion of the projection so as to be engaged with the connecting projection 58 provided on the connection guide bar 55, as shown in FIG. 12. The other connector 35 between the pipe 32 and the rotary shaft $31A_2$ has a connection guide opening 62 at the end of the shaft opposite the gear 36 mounted on the shaft, and a connecting member 63 extending across the opening in the diametral direction of the shaft, as shown in FIGS. 13 and 14. The connector 35 also has a connecting projection 60 integrally provided on the central portion of a connecting member 59 provided at the end of the water feed pipe 32, and a connecting opening 61 provided in the central portion of the projection so as to be engaged with the connecting member 63 provided at the rotary shaft $31A_2$, as shown in FIG. 12.

The operation of the connectors 34 and 35 is briefly described from now on. The connecting member 63 of the connector 35 at the rotary shaft $31A_2$ is first engaged in the connecting opening 61 of the connector 35 at the water feed pipe 32. The connecting projection 60 of the other connector 34 at the other rotary shaft 31A! is pushed in by a hand against the force of the spring 54 so that the connecting projection 58 on the rotary shaft is engaged in the connecting opening on the water feed pipe 32. The hand is then taken off the connection 34. As a result, the water feed pipe 32 is surely connected to the rotary shafts $31A_1$ and $31A_2$ so that the lower wetting roller 31A is installed. When the water feed pipe 32 of the lower wetting roller 31A is to be disconnected from the rotary shafts $31A_1$ and $31A_2$, the stopper pin 57 of the connector 34 for the rotary shaft $31A_1$ is moved toward the pulley 51 by a hand against the force of the spring 54 to push the connecting projection 60 in to disengage the connecting projection 58 on the rotary shaft $31A_1$ from the connecting opening 61 at the water feed pipe and disengage the connecting member 63 of the connector 35 for the rotary shaft $31A_2$ from the connecting opening 61 of the connector at the water feed pipe. When the upper wetting roller 31B is to be installed, the bearings 40 provided on the water feed pipe 32 of roller at both the ends of the pipe so as to be removably fitted in the U-shaped notches 41 of the frame 17C of the upstream conveyor 17 are lifted together with the roller by a hand and fitted in the notches. When the roller 31B is to be removed, the bearings 40 are lifted together with the roller by hand.

Figure 15:
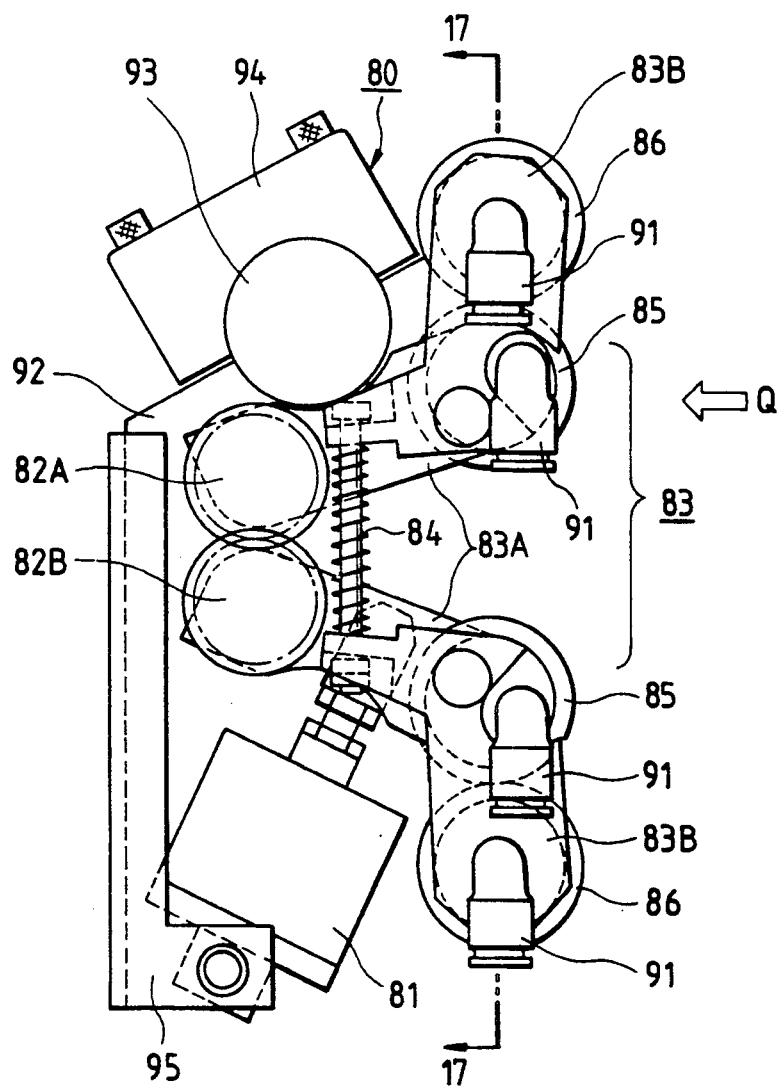
FIGS. 15, 16 and 17 are views for briefly explaining the constitution of the water suction unit of the apparatus.
Figure 16:
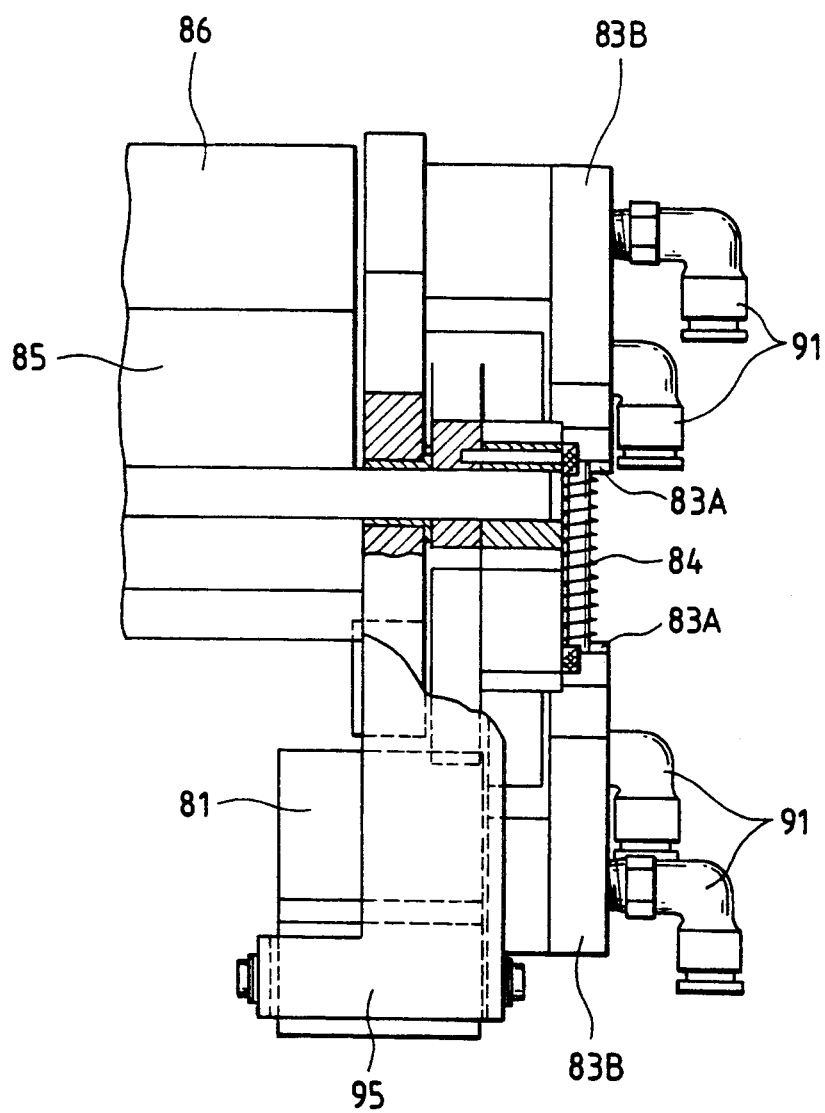
Figure 17:
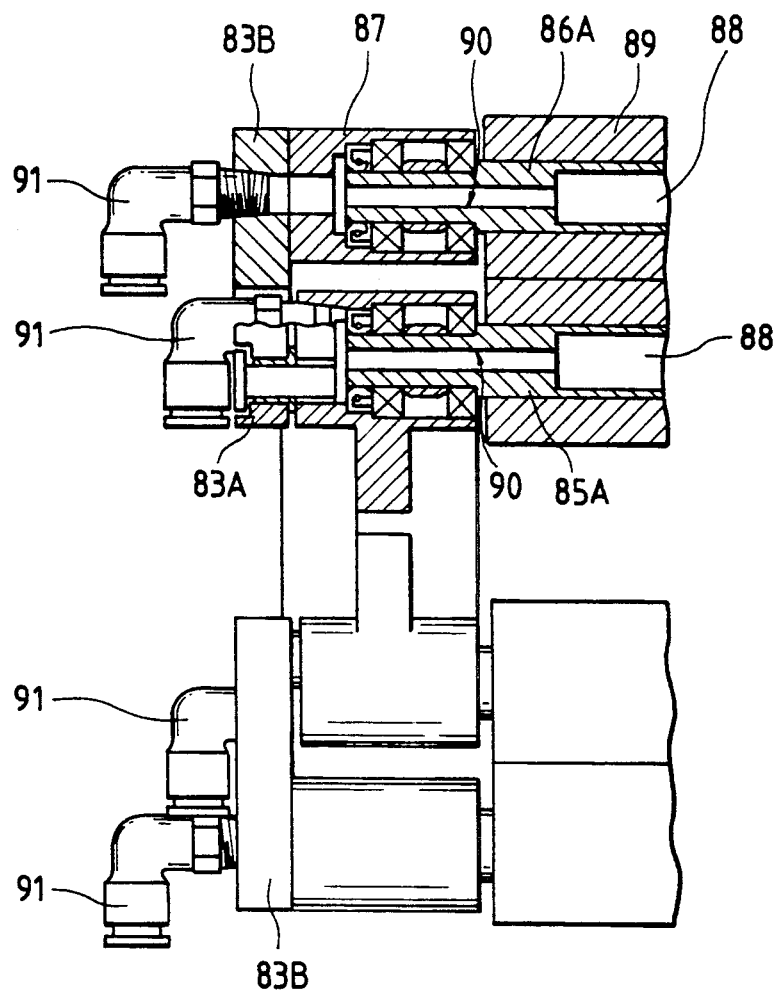

A water suction unit 80 for removing the water from the multi-layer films 1B bonded to the electroconductive layers on the electrically insulating base plate 11 is provided downstream to the heat and pressure bonding roller 16 in the direction of the conveyance of the base plate. The water suction unit 80 has a pair of link mechanisms 83 coupled to each other through matching gears 82A and 82B, which are rotated by the moving member of a pneumatic cylinder 81, as shown in FIGS. 15, 16 and 17. FIG. 15 is a side view of the water suction unit 80. FIG. 16 is a front view of the water suction unit 80 seen along an arrow Q shown in FIG. 15. FIG. 17 is a sectional view of the suction unit 80 along a line 17—17 shown in FIG. 15. Each of the link mechanisms 83 has a first link 83A and a second link 83B. The first link 83A is pushed outward by a compressed spring 84. A base plate wiping roller 85 is attached to the first link 83A so that the excess water which is an air bubble preventive agent remaining on the multi-layer film 1B bonded to the electroconductive layer on the base plate 11 is removed therefrom by the wiping roller. A heat and pressure bonding roller wiping roller 86 is attached to the second link 83B so that the excess water which is an air bubble preventive agent remaining on the heat and pressure bonding roller 16 is removed therefrom by the wiping rollers. The wiping roller 85 and 86 are rotatably supported by rotary shafts 85A and 86A and bearers 87 having bearings, as shown in FIGS. 16 and 17. Each of the wiping rollers 85 and 86 has a pipe 88 having water drain holes, and a water suction material 89 which covers the outside circumferential surface of the pipe and is a heat-resistant porous material such as a cloth and sponge, as shown in FIG. 17. The pipes 88 of the wiping rollers 85 and 86 are connected to air discharge holes 90 provided in the central portions of the rotary shafts 85A and 86A and connected to aid discharge pipes 91, respectively. The matching gears 82A and 82B are attached to a mounting block 92 coupled to a shaft 93 by an attaching member 94. The pneumatic cylinder 81 is secured to the mounting frame 95 of the body of the apparatus.

Figure 18:
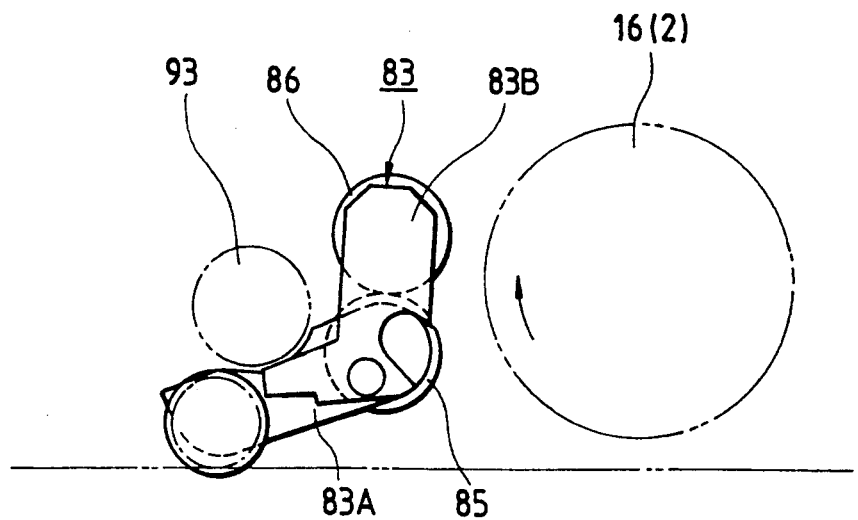
FIGS. 18. 19 and 20 are views for explaining the operation of the water suction unit.
Figure 19:
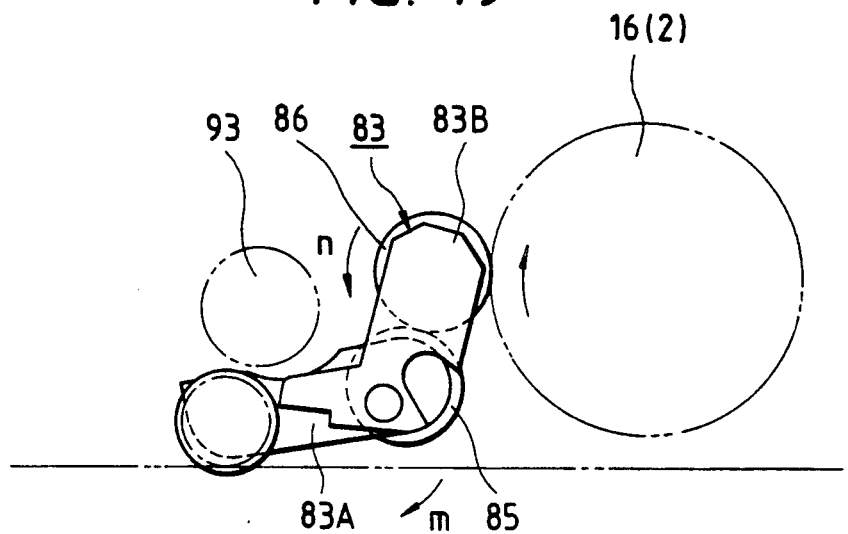
Figure 20:
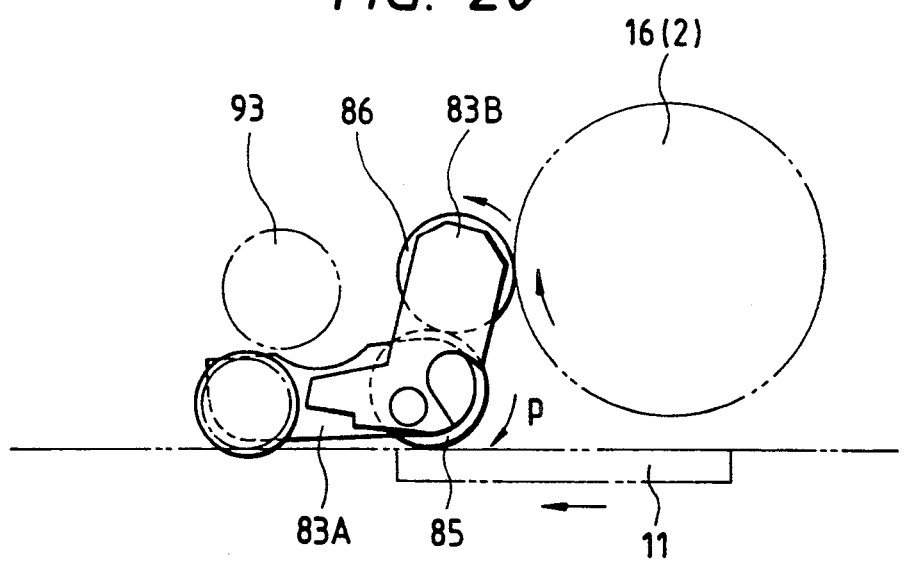

The operation of the water suction unit 80 is described in detail with reference to FIGS. 18, 19 and 20 from now on. As shown in FIG. 18, the angle between the first and second links 83A and 83B of the link mechanism 83 is larger than 90 degrees or is an obtuse angle when the water suction unit 80 is in the home position thereof. When the moving member of the pneumatic cylinder 81 is pushed out against the elongative force of the compressed spring 84, the first link 83A of the link mechanism 83 is swung in a direction m as shown in FIG. 19, such that the link approaches the electrically insulating base plate 11. At that time, the heat and pressure bonding roller wiping roller 86 attached to the second link 83B of the link mechanism 83 comes into contact with the heat and pressure bonding roller 16 and starts rotating in a direction n so that the water which is the excess air bubble preventive agent remaining on the bonding roller is removed therefrom by the wiping roller. When the moving member of the pneumatic cylinder 81 is pushed out further, the first link 83A is swung further in the direction m so that the link further approaches the base plate 11, and the angle between the first and the second links 83A and 83B becomes nearly 90 degrees. At that time the base plate wiping roller 85 attached to the first link 83A starts rotating in a direction p so that the excess water which is the air bubble preventive agent remaining on the film bonded to the base plate 11 is removed therefrom by the wiping roller 85. Since the excess water remaining on the multi-layer films 1B bonded to the base plate 11 is thus removed therefrom by the water suction unit 80 provided downstream to the heat and pressure bonding roller 16 in the direction of the conveyance of the base plate, stains, contamination or the like are prevented from being made on the roller and the films due to water globules. For that reason, the reliability of making a wiring pattern for the printed circuit board by exposure to light and the yield in the making are enhanced. As a result, not only the adhesion of the base plate 11 and the multi-layer films 1B but also the reliability of the wirings of the printed circuit board are improved.

Figure 21:
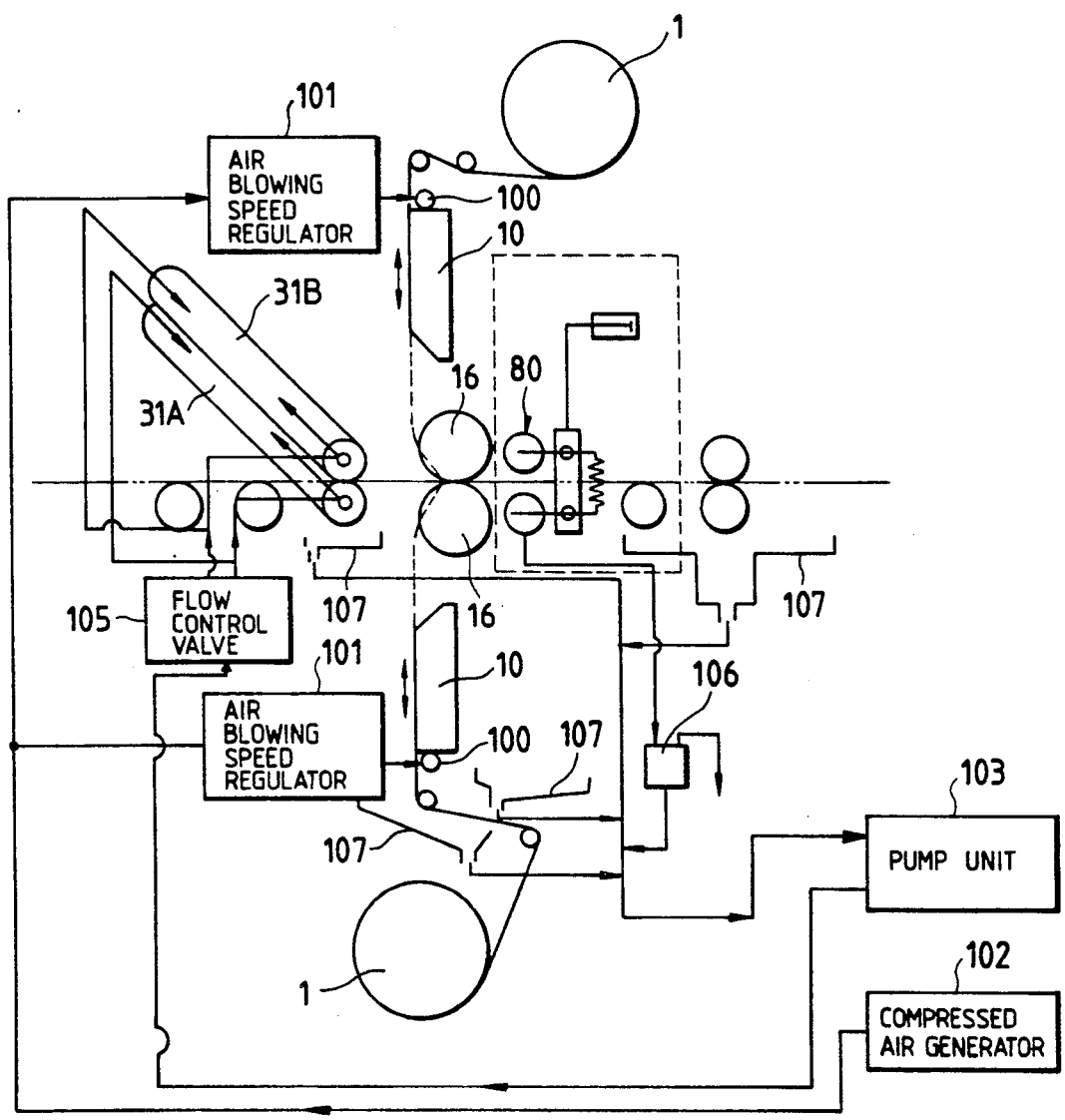
FIG. 21 is a diagram for briefly explaining the construction of the water feed and suction system of the apparatus.

As shown in FIG. 21, an air blowing nozzle unit 100 for separating the film 1B from the main vacuum suction plate 10, after the film is initially bonded to the electroconductive layer on the base plate 11, is provided on the main vacuum suction plate. The nozzle unit 100 is connected to a compressed air generator 102 through an air blowing speed regulator 101, by which the speed of the blown air is adjusted if necessary. Since the water is applied to the electroconductive layer on the base plate 11 before the bonding of the film 1B thereto and wets the initial bonding head 10E of the main vacuum suction plate 10 and the suction plate is likely to be dewed with steam, the nozzle unit 100 is provided to prevent the problem that the multi-layer film clings to the initial bonding head 10E or/and other portion of the main vacuum suction plate 10 because of the wetting or/and dewing and follows the movement thereof so as to be peeled from the electroconductive layer on the base plate 11 after being initially bonded thereto.

A pump 103, a flow control valve 105 for regulating the flow rate of the water to be fed to the lower and the upper wetting rollers 31A and 31B, a trap 106 for removing the water from a suction flow, and a water receiver 107 are provided as shown in FIG. 21. When the lower wetting receiver 31A is rotated by a conveyance roller drive belt so that the upper wetting roller 31B is also rotated and the water is applied as an air bubble preventive agent to the electroconductive layer on the base plate 11 while the plate is being conveyed, the excess portion of the water is received by the water receiver 107 and then sent to the pump 103 through a drain hose. The water removed at the time of the bonding of the film 1B to the electroconductive layer on the base plate 11 by the heat and pressure bonding roller 16 and the water having clung to the film bonded to the layer are also received by the water receiver 107 and then sent to the pump 103 through the drain hose. The flow rate of the water from the pump 103 to the lower and the upper wetting rollers 31A and 31B is regulated by the flow control valve 105.

As mentioned above, the water is applied as an air bubble preventive agent to the electroconductive layer on the electrically insulating base plate 11 by the lower and upper wetting rollers 31A and 31B of the wetting roller unit 30 before the base plate and the film 1B are moved to the initial bonding position. The film 1B is put into contact with the initial bonding head 10E so that the leading edge of the film is bonded to the leading edge of the electroconductive layer on the base plate 11 by the initial bonding head. After the initial bonding head 10E is moved back from the base plate 11, the heat and pressure bonding roller 16 is put into contact with the bonded leading edge of film 1B at the initial bonding position and rotated so that the base plate is conveyed and the film is completely bonded to the electroconductive layer. At that time, the water in the minute recesses of the surface of the electroconductive layer on the base plate 11 prevents air bubbles from being made in the recesses, and dissolves the photosensitive resin of the multi-layer film to make an adhesive of the resin, if the resin is water-soluble. This puts the film into tight contact with the surface of the electroconductive layer and avoids leaving the air bubbles between the mutually bonded surfaces of the electroconductive layer and the film. For that reason, the adhesion of the film 1B and the electroconductive layer on the base plate 11 and the reliability of the wirings of the printed circuit board are improved.

It is preferable that the photosensitive resin of the film 1B is water-soluble.

A surface tension adjusting agent, a copper surface adhesive agent or the like may be added to the water, which is applied as an air bubble preventive agent to the electroconductive layer on the base plate 11.

As shown in FIG. 1, a sensor S1 for detecting the position of the leading edge of the base plate 11 is provided at the upstream conveyor 17 and located in a base plate leading edge detecting position near the conveyance passage for the base plate upstream to the initial bonding position. When the leading edge of the base plate 11 is detected by the sensor S1, the sensor sends out a detection signal for putting the preset counter of a microcomputer into action. When the preset counter has counted a number corresponding to a prescribed length, the counter sends out a control signal for stopping the leading edge of the base plate 11 in the initial bonding position. The sensor S1 is a photoelectric switch, for example.

A sensor S2 for detecting the position of the trailing edge of the base plate 11 is provided at the upstream conveyor 17 and located in a base plate trailing edge detecting position near the conveyance passage for the base plate upstream to the sensor S1. When the trailing edge of the base plate 11 is detected by the sensor S2, it sends out a detection signal for putting another preset counter of the microcomputer into action. When this preset counter has counted a number corresponding to a prescribed time, the counter sends out a control signal in order to make the loosened part 1B of the film 1B near the trailing edge thereof, cut off the film by the cutoff unit 14, and bond the trailing edge of the cut-off film to the electroconductive layer on the base plate 11, under heat and pressure, the preset counter also sends out a control signal to bond the trailing edge of the film 1B to the electroconductive layer on the base plate 11, under heat and pressure, and move the heat and pressure bonding roller 16 from the initial bonding position to the put-aside position. The sensor S2 is a photoelectric switch, for example, as is the sensor S1.

A downstream conveyor 18, including lower conveyance rollers 18A and upper conveyance rollers 18B, functions so that the base plate with the film 1B bonded to the electroconductive layer by the heat and pressure bonding roller 16 is conveyed to an exposure unit for making the wiring pattern for the printed circuit board.

As shown in FIGS. 1 and 2, a film corrector 19 is provided at the body 7 of the apparatus, the upstream conveyor 17 or the support member 12 near the movement passage for the initial bonding head 10E of the main vacuum suction plate 10 so as to orient the film 1B at the leading edge thereof in such a direction G as to put the leading edge into tight contact with the initial bonding head 10E. The film corrector 19 includes a fluid conduction pipe 19A extending along the width of the film 1B, and a plurality of fluid blowing holes 19B provided in the pipe. A fluid higher in pressure than the atmosphere is caused to flow in the fluid conduction pipe 19A. The cross section of the pipe 19A is nearly circularly shaped, but may be squarely or elliptically shaped. The fluid is blown out of each of the fluid blowing holes 19B in such a direction as to orient the film 1B in the direction G. The fluid is air, but may be another gas such as inert gas or a liquid such as water and oil.

As shown in FIGS. 1 and 2, a film protruder 20 is provided at the body 7 of the apparatus, the upstream conveyor 17 or the support member 12 near the position of the film 1B fed in between the lower sucking portion 13b of the auxiliary vacuum suction plate 13 and the rotary vacuum suction bar 15, and functions to make the loosened part 1B of the film 1B in such a direction H as to put the loosened part into tight contact with the heat and pressure bonding roller 16. The film protruder 20 includes a fluid conduction pipe 20A extending along the width of the film 1B, and a plurality of fluid blowing holes 20B provided in the pipe. A fluid higher in pressure than the atmosphere is caused to flow in the pipe 20A. The cross section of the pipe 20A is nearly circularly shaped, but may be squarely or elliptically shaped, as well as the former fluid conduction pipe 19A. The fluid is blown out of each of the fluid blowing holes 20B in such a direction as to protrude the film 1B to make the loosened part 1B' thereof. The fluid is air, but may be another gas such as inert gas or a liquid such as water and oil.

Each of the film corrector 19 and the film protruder 20 may be made of a plurality of fluid blowing nozzles juxtaposed along the width of the multi-layer film 1B to blow the fluid to orient or protrude the film in the proper direction. Each of the film corrector 19 and the film protruder 20 may be made of a suction pipe extending along the width of the film, and a plurality of suction holes provided in the pipe to orient or protrude the film in the proper direction. Each of the film corrector 19 and the film protruder 20 may be made of a projection member to orient or protrude the film 1B in the proper direction. The film corrector 19 may be substituted by the film protruder 20, and vice versa.

As shown in FIGS. 1 and 2, a base plate guide member 21 is provided at the body 6 of the apparatus or the downstream conveyor 18 between the driving conveyance roller 18A of the conveyor and the heat and pressure bonding roller 16 located in the initial bonding position. The guide member 21 functions so that the base plate with the film 1B stuck to the electroconductive layer thereon under heat and pressure is guided from the position of the heat and pressure bonding (the position of the initial bonding). For example, the guide member 21 is made of a plurality of bars extending in the direction of the conveyance of the base plate 11 and juxtaposed along the width thereof as the teeth of a comb. Since the area of the contact of the guide member 21 with the base plate 11 being conveyed is thus made small, the frictional resistance of the guide member to the base plate is made so low that the base plate is smoothly guided by the member. The guide member 21 may be shaped as a net or a plate.

An alternative method of bonding the film 1B to the electroconductive layer on the electrically insulating base plate 11 by the thin film bonding apparatus is briefly described with reference to FIGS. 1 and 2 from now on. The method is a second preferred embodiment. The leading edge of the film 1B divided by the film separation roller 3 is first manually placed between the auxiliary vacuum suction plate 13 and the cutoff unit 14. The leading edge of the film 1B is thereafter sucked by the auxiliary vacuum suction plate 13. The plate 13 is then moved, by the driver 13A, to such a position that the plate is separated from the feed passage for the film 1B and the leading edge of the film is sucked on the initial bonding head 10E. At that time, the main vacuum suction plate 10 and the initial bonding head 10E are put into sucking action, and the film 1B is properly oriented so that the leading edge thereof is securely sucked onto the initial bonding head 10E. If the apparatus is already in automatic continuous operation, the leading edge of the film 1B cut off by the cutoff unit 14 is sucked onto the initial bonding head 10E.

The base plate 11 is then conveyed by the driving conveyance rollers 17A and idle conveyance rollers 17B of the upstream conveyor 17. Before the base plate 11 reaches the initial bonding position, the water is applied as an air bubble preventive agent to the electroconductive layer on the base plate by the lower and upper wetting rollers 31A and 31B of the wetting roller unit 31. When the leading edge of the base plate 11 is detected by the sensor S1 in the base plate leading edge detecting position so that the detection signal is sent out from the sensor to the microcomputer. As a result, one of the preset counters of the microcomputer counts the number corresponding to the prescribed time, and the other of the preset counters counts the number corresponding to a prescribed time, at the end of which the movement of the initial bonding head 10E to the vicinity of the conveyance passage for the base plate is started while the leading edge of the base plate is being conveyed from the base plate leading edge detecting position to the initial bonding position. In that state, the initial bonding head 10E is in a start position, and the heat and pressure bonding roller 16 is in the putaside position. At that time, the driver 12D for moving the main vacuum suction plate 10 while the upper and the lower support members 12 remain stopped nearest the conveyance passage for the base plate 11 is in action.

Moving the initial bonding head 10E to the vicinity of the conveyance passage for the base plate 11 is then started while the leading edge of the base plate is being conveyed from the base plate leading edge detecting position to the initial bonding position. The starting is performed by controlling the driver 12D through the computer on the basis of the output signal from the latter preset counter. When the leading edge of the base plate 11 has reached the initial bonding position, the conveyance of the base plate is stopped on the basis of the output signal from the former preset counter. Substantially at the same time as the stoppage of the conveyance or slightly after the stoppage, the initial bonding head 10E comes into contact with the leading edge of the electroconductive layer on the base plate 11 so that the leading edge of the film 1B sucked on the initial bonding portion is bonded to the edge of the electroconductive layer, under heat and pressure.

In the method, the leading edge of the base plate 11 is detected at the base plate leading edge detecting position before the plate reaches the initial bonding position, as described above. The signal of the detection is generated so that the leading edge of the base plate 11 is stopped in the initial bonding position after the edge is moved from the base plate leading edge detecting position to the initial bonding position. The initial bonding head 10E is moved to the vicinity of the base plate conveyance passage while the leading edge of the base plate 11 is being conveyed from the leading edge detecting position to the initial bonding position. After the leading edge of the base plate 11 is stopped in the initial bonding position, the leading edge is bonded to the electroconductive layer on the base plate by the initial bonding head 10E. A part of the period during which the initial bonding head 10E is moved to the vicinity of the base plate conveyance passage is thus overlapped with the period during which the leading edge of the base plate 11 is conveyed from the base plate leading edge detecting position to te initial bonding position. For that reason, the period from the stoppage of the leading edge of the base plate 11 in the initial bonding position to the end of the bonding of the leading edge is shortened so that the time which it takes to bond the entire film 1B to the electroconductive layer on the base plate is reduced. As a result, the number of the films 1B to be conducted to the electroconductive layers on the base plates 11 within a unit time is increased, namely, the efficiency of the bonding is enhanced. When the initial bonding head 10E has come into contact with the leading edge of the electroconductive layer on the base plate 11, the driver 12D is put into action. The information that the driver 12D is put into action is entered into the microcomputer. After the operation for initial bonding of the leading edge of the film 1B to that of the electroconductive layer on base plate 11 is maintained by the microcomputer for a prescribed time, the main vacuum suction plate 10 and the initial bonding head 10E are put out of sucking action and then moved away from the base plate conveyance passage by the drivers 12C and 12D. At that time, the drivers 12C and 12D move the main vacuum suction plate 10 and the initial bonding head 10E. The auxiliary vacuum suction plate 13 is also moved to positions farther from the base plate conveyance passage than positions shown in FIGS. 1 and 2. The length of the movement is proportional to that of the loosened part 1B' of the multi-layer film 1B.

Before the main vacuum suction plate 10 and the initial bonding head 10E are moved from the base plate conveyance passage by the drivers 12C and 12D, the air is blown in between the multi-layer film 1B and each of the main vacuum suction plate, the initial bonding head and the auxiliary vacuum suction plate 13 from the air blowing nozzle unit 100 so that the film is separated from the main vacuum suction plate 10 and the initially bonded head 10E. The heat and pressure bonding roller 16 is then moved from the put-aside position shown by the dotted line in FIG. 1 to the initial bonding position shown by the full line therein, so that the roller comes into contact with the film 1B bonded at the leading edge thereof to the electroconductive layer on the base plate 11. The upper and the lower rollers 16 thus pinching the films 1B and the base plate 11 are rotated so that the films are completely bonded to the electroconductive layers on the base plate, under heat and pressure. At that time, the main vacuum suction plate 10, the initial bonding head 10E and the auxiliary vacuum suction plate 13 are already put out of sucking action, and each film 1B is automatically fed from the supply roller 2 to the heat and pressure bonding roller 16 by the rotary force of the bonding roller and the pinching force thereof on the film and the base plate 11.

The excess water remaining on the heat and pressure bonding roller 16 and the film 1B bonded to the electroconductive layer on the base plate 11 is removed from them at the same time, by the water suction unit 80 located downstream to the roller in the direction of the conveyance of the base plate.

After the film 1B has been bonded by a prescribed length to the electroconductive layer on the base plate 11 by the heat and pressure bonding roller 16, the trailing edge of the base plate is detected by the sensor S2 in the base plate trailing edge detecting position shown in FIG. 1. The detection signal is sent out from the sensor S2 to the microcomputer so that the main vacuum suction plate 10, the auxiliary vacuum suction plate 13 and the rotary vacuum suction bar 15 are substantially simultaneously put into sucking positions. The driver 12C moves the support member 12 from the position thereof, which is the farthest from the base plate conveyance passage, so that the film 1B is excessively fed to the base plate by the main vacuum suction plate 10. The part of the film 1B, which is to be cut off to become the trailing edge of the film, is placed in the position of the cutoff, by the lower sucking portion 13b of the auxiliary vacuum suction plate 13, as shown in FIG. 2. The speed of the feed of the film 1B, which is equal to that of the movement of the support member 12, is set to be higher than that of the heat and pressure bonding of the film by the roller 16, which is equal to the circumferential velocity of the roller. For that reason, the loosened part 1B' can be made of the film 1B between the auxiliary vacuum suction plate 10 and the rotary vacuum suction bar 15. The trailing and leading ends of the loosened part 1B' can be surely sucked on the lower sucking portion 13b of the auxiliary vacuum suction plate 13 and the rotary vacuum suction bar 15, respectively, through the action of the film corrector 19.

The part of the film 1B, which is placed in the cutoff position as mentioned above, is cut off by the cutoff unit 14 so that the cut-off film has a prescribed length corresponding to the length of the base plate 11. The heat and pressure bonding roller 16 is then moved in the same direction as the conveyance of the base plate 11 so that the film 1B is bonded, under heat and pressure, to the electroconductive layer on the base plate from the leading edge of the film toward the trailing edge thereof. The roller 16 is moved further along with the conveyance of the base plate 11 until the trailing edge of the film 1B is bonded, under heat and pressure, to the electroconductive layer on the base plate, substantially by the rotary vacuum suction bar 15. The roller 16 can be moved to the vicinity of the put-aside position thereof. The bar 15 is rotated at a slightly lower speed than the roller 16 so as to bond the trailing edge of the film 1B to the electroconductive layer on the base plate, under heat and pressure. Since the bar 15 is rotated at the slightly lower speed than the roller 16, appropriate tension is applied to the film 1B between the bar and the roller so that the film is bonded to the electroconductive layer without undergoing a wrinkle or the like.

After the film 1B is entirely bonded to the electroconductive layer on the base plate 11, the heat and pressure bonding roller 16 is moved from the vicinity of the put-aside position thereof to that position in such a direction that the distance from the base plate conveyance passage to the roller increases.

The present invention can be also embodied as a thin film bonding apparatus in which an electrically insulating base plate is preheated, and a film is bonded to the base plate, under pressure, by an unheated pressure sticking roller.

The present invention can be furthermore embodied as a thin film bonding apparatus for bonding a protective film to an ornamental panel which is a building material.

What is claimed is:

1. A thin film bonding method in which a base plate is conveyed to an initial bonding position in a base plate conveyance passage; an initial bonding member holding a leading edge of the thin film is moved into a vicinity of a surface of said plate at a leading edge thereof, the leading edge of the thin film is initially bonded to the surface of the plate at the leading edge thereof, and the member is moved away from the surface of the plate; and a pressure bonding roller is thereafter put into contact with the initially bonded leading edge of the film and rotated so that the plate is conveyed and the film is completely bonded to said plate, the improvement comprising:

applying an air bubble preventive agent to at least one of said thin film and said plate before said thin film is initially bonded to the leading edge of said plate; and removing, by at least one wiping roller, excess air bubble preventive agent remaining on said pressure bonding roller and/or excess air bubble preventive agent remaining on said film after said film is bonded by said pressure bonding roller.

2. A thin film bonding method in which a base plate is conveyed to an initial bonding position in a base plate conveyance passage; an initial bonding member holding a leading edge of the thin film is moved into a vicinity of a surface of said plate at leading edge thereof, the leading edge of the thin film is initially bonded to the surface of the plate at the leading edge thereof, and the member is then moved away from the surface of the plate; and a pressure bonding roller is thereafter put into contact with the initially bonded leading edge of the film and rotated so that the plate is conveyed and the film is completely bonded to said plate, the improvement comprising:

applying an air bubble preventive agent to at least one of said thin film and said plate before said thin film is initially bonded to the leading edge of said plate; and removing excess air bubble preventive agent remaining on said roller and excess air bubble preventive agent remaining on said film after said film is bonded by said roller, wherein said removing step comprises the use of both suction and wiping of said plate and bonding roller.

3. A thin film bonding method in which a base plate is conveyed to an initial bonding position in a base plate conveyance passage; an initial bonding member holding a leading edge of the thin film is moved into a vicinity of a surface of said plate at a leading edge thereof, the leading edge of the thin film is initially bonded to the surface of the plate at the leading edge thereof, and the member is then moved away from the surface of the plate; and a pressure bonding roller is thereafter put into contact with the initially bonded leading edge of the film and rotated so that the plate is conveyed and the film is completely bonded to said plate, the improvement comprising:

applying an air bubble preventive agent to at least one of said thin film and said plate before said thin film is initially bonded to the leading edge of said plate; and removing excess air bubble preventive agent remaining on said roller and excess air bubble preventive agent remaining on said film after said film is bonded by said roller, wherein said removing step includes using first and second wiping rollers to remove excess air bubble preventive agent from the base plate and the bonding rollers, respectively.

4. The method of claim 3, wherein said first and second wiper rollers are covered with porous material, each of said wiper rollers having discharge holes through a central portion thereof, whereby said removing step sucks said excess bubble preventive agent through said porous material and said discharge holes.

5. The method of claim 3, wherein said removing step includes using a pneumatic cylinder to swing said first and second wiper rollers concurrently into contact with the base plate and bonding rollers, respectively, said wiper rollers and said pneumatic cylinder being connected by first and second links, which are connected at nearly a 90° degree angle.

6. The method of claim 3, wherein said applying step includes using wetting rollers, having an interior water feed pipe and an exterior porous coating material, to apply said air bubble preventive agent to said plate.

7. The method of claim 6, wherein said applying step includes using at least one water feeder, rotatably connected with and hermetically sealed to at least one end of one of said wetting rollers, to apply said air bubble preventive agent to said interior water feed pipe.

8. The method of claim 3, wherein said first and second wiper rollers are covered with porous material.

9. The method of claim 3, wherein said second wiper roller is covered with heat resistant porous material and wipes said bonding roller.

10. A thin film bonding method in which a base plate is conveyed to an initial bonding position in a base plate conveyance passage; an initial bonding member holding a leading edge of the thin film is moved into a vicinity of a surface of said plate at a leading edge thereof, the leading edge of the thin film is initially bonded to the surface of the plate at the leading edge thereof, and the member is then moved away from the surface of the plate; and a pressure bonding roller is thereafter put into contact with the initially bonded leading edge of the film and rotated so that the plate is conveyed and the film is completely bonded to said plate, the improvement comprising:

applying an air bubble preventive agent to at least one of said thin film and said plate before said thin film is initially bonded to the leading edge of said plate; and removing excess air bubble preventive agent remaining on said roller and excess air bubble preventive agent remaining on said film after said film is bonded by said roller, wherein said removing step uses suction to remove said excess air bubble preventive agent.

* * * * *